United States Patent
Zhao et al.

(10) Patent No.: US 11,063,067 B2
(45) Date of Patent: Jul. 13, 2021

(54) DISPLAY SUBSTRATE AND REPAIRING METHOD THEREOF, AND DISPLAY DEVICE

(71) Applicant: BOE TECHNOLOGY GROUP CO., LTD., Beijing (CN)

(72) Inventors: Detao Zhao, Beijing (CN); Li Xiao, Beijing (CN); Lei Wang, Beijing (CN); Can Zhang, Beijing (CN); Can Wang, Beijing (CN); Han Yue, Beijing (CN); Minghua Xuan, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/618,291

(22) PCT Filed: May 16, 2019

(86) PCT No.: PCT/CN2019/087207
§ 371 (c)(1),
(2) Date: Nov. 29, 2019

(87) PCT Pub. No.: WO2019/219057
PCT Pub. Date: Nov. 21, 2019

(65) Prior Publication Data
US 2020/0119055 A1    Apr. 16, 2020

(30) Foreign Application Priority Data

May 17, 2018   (CN) .......................... 201810475463.1

(51) Int. Cl.
*H01L 27/12*   (2006.01)
*H01L 27/32*   (2006.01)

(52) U.S. Cl.
CPC ...... *H01L 27/1244* (2013.01); *H01L 27/1259* (2013.01); *H01L 27/3276* (2013.01)

(58) Field of Classification Search
CPC .......... H01L 2251/568; H01L 27/1214; H01L 27/1244; H01L 27/1259; H01L 27/3276
See application file for complete search history.

(56) References Cited

U.S. PATENT DOCUMENTS

| 7,474,115 B1 * | 1/2009 | Trujillo .................. G09G 3/006 324/762.07 |
| 10,186,179 B2 * | 1/2019 | Apte ...................... G09G 3/006 |

(Continued)

FOREIGN PATENT DOCUMENTS

| CN | 101408681 A | 4/2009 |
| CN | 202534323 U | 11/2012 |

(Continued)

OTHER PUBLICATIONS

First Office Action dated Jun. 1, 2020, for corresponding Chinese application 201810475463.1.

*Primary Examiner* — Chun-Nan Lin
(74) *Attorney, Agent, or Firm* — Nath, Goldberg & Meyer; Joshua B. Goldberg

(57) ABSTRACT

The present disclosure provides a display substrate, a repairing method, and a display device, the display substrate includes a plurality of driving circuits, each of which is configured to drive a display element in each of at least one sub-pixel to display, an output terminal of each driving circuit is coupled to the display element in the sub-pixel driven by the driving circuit through a branch having a switching element, the display substrate further includes: at least one repair line, which is configured to be associated with at least two driving circuits and initially decoupled from an output terminal of at least one of the at least two driving circuits, and the repair line is couplable to the output terminals of the at least two driving circuits with which the repair line is associated in response to a failure of one of the at least two driving circuits.

14 Claims, 4 Drawing Sheets

(56) References Cited

U.S. PATENT DOCUMENTS

| | | | |
|---|---|---|---|
| 10,643,532 B2 * | 5/2020 | Wang | G09G 3/006 |
| 2007/0109235 A1 * | 5/2007 | Hsu | G09G 3/3611 |
| | | | 345/87 |
| 2015/0212379 A1 * | 7/2015 | Wang | G02F 1/13452 |
| | | | 257/499 |

FOREIGN PATENT DOCUMENTS

| | | |
|---|---|---|
| CN | 103810965 A | 5/2014 |
| CN | 105044946 A | 11/2015 |
| CN | 107942556 A | 4/2018 |
| CN | 108538863 A | 9/2018 |
| KR | 20040083656 A | 10/2004 |
| KR | 20080022716 A | 3/2008 |

* cited by examiner

US 11,063,067 B2

DISPLAY SUBSTRATE AND REPAIRING METHOD THEREOF, AND DISPLAY DEVICE

CROSS REFERENCE TO RELATED APPLICATIONS

This is a National Phase Application filed under 35 U.S.C. 371 as a national stage of PCT/CN2019/087207, filed May 16, 2019, which claims priority of a Chinese application having an application number 201810475463.1, entitled "display substrate and repairing method thereof, display device" filed in Chinese Intellectual Property Office on May 17, 2018, and the entire disclosure of the applications are incorporated herein by reference.

TECHNICAL FIELD

The present disclosure relates to the technical field of a pixel circuit, and particularly relates to a display substrate and a repairing method thereof, and a display device.

BACKGROUND

In a display substrate, each of sub-pixels is provided with a corresponding driving circuit (also referred to as a pixel circuit) for driving a display element in the sub-pixel to display.

Since a structure of the pixel circuit is complex, faults such as short circuit and open circuit are likely to occur, and once the pixel circuit fails to work normally, the display element in the sub-pixel coupled to the pixel circuit cannot display normally, which may affect the display effect.

SUMMARY

According to an aspect of the present disclosure, there is provided a display substrate including a plurality of driving circuits, each of which is configured to drive a display element in each of at least one sub-pixel to perform display, an output terminal of each of the driving circuits is coupled to the display element in the sub-pixel driven by the driving circuit through a branch having a switching element therein, the display substrate further including: at least one repair line, each of which is configured to be associated with at least two driving circuits and to be initially decoupled from an output terminal of at least one of the at least two driving circuits, each repair line is couplable to the output terminals of the at least two driving circuits with which the repair line is associated in response to a failure of one of the at least two driving circuits.

In some implementations, the plurality of driving circuits are arranged in an array, each row of driving circuits is controlled by a gate line, each repair line is configured to be associated with two adjacent driving circuits of a same row and is initially decoupled from the output terminal of at least one of the two adjacent driving circuits, and each repair line is couplable to the output terminals of the two adjacent driving circuits in response to a failure of one of the two adjacent driving circuits.

In some implementations, the plurality of driving circuits are arranged in an array, each row of driving circuits is controlled by a gate line, any two driving circuits in a same row of driving circuits are grouped into a group, each repair line is configured to be associated with one group of driving circuits and is initially decoupled from the output terminal of at least one driving circuit in the group of driving circuits, each repair line is couplable to the output terminals of the group of driving circuits in response to a failure of one of the group of the driving circuits.

In some implementations, the plurality of driving circuits are arranged in an array, each row of driving circuits is controlled by a gate line, one driving circuit in each row of driving circuits is configured as a dedicated repair driving circuit, other than the dedicated repair driving circuit, each repair line is configured to be associated with the dedicated repair driving circuit and at least one other driving circuit in the same row as the dedicated repair driving circuit, and is initially decoupled from an output terminal of at least one of the dedicated repair driving circuit and the at least one other driving circuit, and each repair line is couplable, in response to a failure of a fault driving circuit of the at least one other driving circuit, to the dedicated repair driving circuit and the output terminal of a fault driving circuit.

In some implementations, the plurality of driving circuits are arranged in an array, each row of driving circuits is controlled by a gate line, the driving circuits associated with each repair line is located in a same row, the display elements in the sub-pixels driven by the driving circuits associated with each repair line display same colors, and each repair line is initially decoupled from the output terminal of at least one of the driving circuits associated with the repair line, and each repair line is couplable, in response to a failure of a fault driving circuit of the driving circuits associated with the repair line, to the output terminals of the driving circuit which normally works and the fault driving circuit in the driving circuits associated with the repair line.

In some implementations, each of the driving circuits is configured to drive display elements in n sub-pixels to perform display, and for each of the driving circuits, the output terminal of the driving circuit is coupled to the display elements in the sub-pixels driven by the driving circuit through branches each having a switching element therein, wherein n is an integer greater than or equal to 2.

In some implementations, for each of the driving circuits, the output terminal of the driving circuit is coupled to the display elements of the n sub-pixels driven by the driving circuit through the n branches each having a switching element therein, the switching elements of the n branches being controlled by separate control lines, respectively.

In some implementations, the plurality of driving circuits are arranged in an array, each row of driving circuits is controlled by a gate line, the switching elements in the branches coupled to the output terminals of a same row of driving circuits share n control lines, and each of the switching elements in the n branches coupled to the output terminal of each of the driving circuits of the same row is controlled by one of the n control lines.

In some implementations, the switching element is a switching transistor, a first electrode of the switching transistor is coupled to the output terminal of the driving circuit, a second electrode of the switching transistor is coupled to the display element in the sub-pixel driven by the driving circuit, and a gate of the switching transistor is coupled to a corresponding control line.

In some implementations, for the at least two driving circuits associated with the repair line, the display elements in the sub-pixels driven by the respective driving circuits display colors in a same color distribution.

In some implementations, each repair line is insulated from the output terminals of the at least two driving circuits associated with the repair line through an insulating layer, and an orthographic projection of the repair line on the insulating layer is at least partially overlapped with an orthographic projection of the output terminals of the at least two driving circuits associated with the repair line on the insulating layer.

In some implementations, each driving circuit is associated with one repair line.

In some implementations, the display substrate is an organic light emitting diode array substrate, the driving circuit includes an organic light emitting diode driving circuit, and the display element includes an organic light emitting diode.

According to another aspect of the present disclosure, there is provided a method of repairing a display substrate described above, the method including: searching for a driving circuit with a fault as a fault driving circuit; selecting a repair line associated with the fault driving circuit as a target repair line, and taking another driving circuit other than the fault driving circuit, which is associated with the target repair line and works normally, as a target driving circuit; decoupling the fault driving circuit from its output terminal; and respectively coupling the target repair line with the output terminal of the fault driving circuit and the output terminal of the target driving circuit, respectively, where the target driving circuit drives the display element in the sub-pixel originally driven by the fault driving circuit to perform display.

In some implementations, decoupling the fault driving circuit from its output terminal includes: cutting off the coupling between the fault driving circuit and the output terminal of the fault driving circuit by using a laser cutting method.

In some implementations, coupling the target repair line to the output terminal of the fault driving circuit and the output terminal of the target driving circuit includes: coupling the target repair line to the output terminal of the fault driving circuit and the output terminal of the target driving circuit by using a laser short-circuiting method.

According to yet another aspect of the present disclosure, there is provided a display device, including: the display substrate described above.

DETAILED DESCRIPTION

In order to make those skilled in the art understand the technical solutions of the present disclosure better, the solutions of the present disclosure will be described in detail with reference to the accompanying drawings and specific embodiments.

In an embodiment of the present disclosure, a pixel circuit may be multiplexed, that is, each of pixel circuits is coupled to display elements in a plurality of sub-pixels respectively through a plurality of branches, each of the branches is provided with a switching element, and the display elements in the sub-pixels may be driven by the pixel circuit in turn by turning on the switching elements in the branches in turn, which may reduce the number of the pixel circuits in the display substrate and an area occupied by the pixel circuits, and thus improve a resolution of the display substrate.

However, the pixel circuit to be multiplexed has a more complicated structure, and faults such as short circuit and open circuit are more likely to occur therein, in a case where one pixel circuit fails to work normally, the display elements in the sub-pixels coupled to the pixel circuit cannot display normally, which seriously affects the display effect.

Technical solutions of the present disclosure are not only suitable for a mode that the pixel circuits are not multiplexed, but also suitable for a mode that the pixel circuits are multiplexed. Although the drawings of the present disclosure only show a case where the pixel circuits are multiplexed, a person skilled in the art may obtain the mode that the pixel circuits are not multiplexed by making the pixel circuits drive the display elements in the sub-pixels to display in one-to-one correspondence, and details thereof are not repeated herein.

Figure 1:
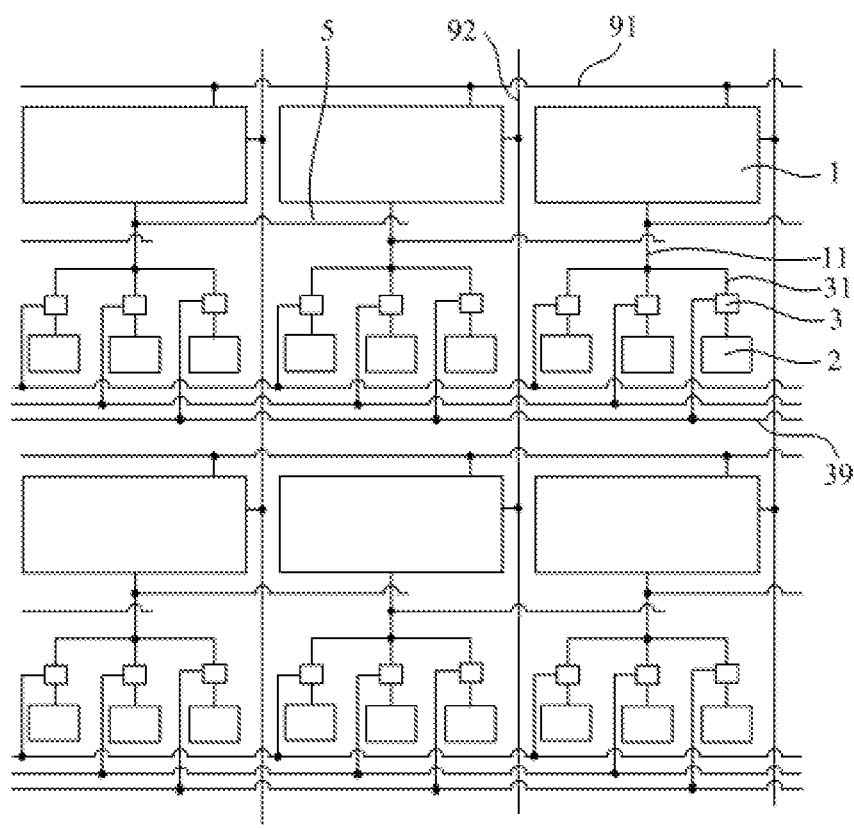
FIG. 1 is a partial structural diagram of a display substrate according to an embodiment of the present disclosure.
Figure 2:
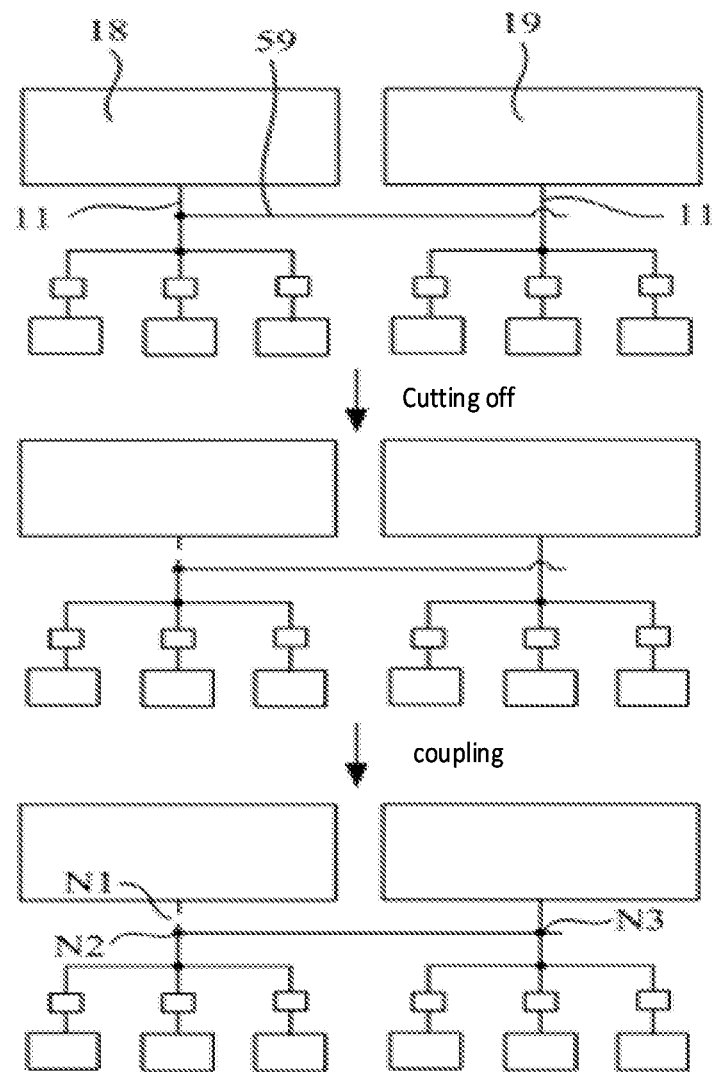
FIG. 2 is a schematic diagram of a process of repairing a display substrate according to an embodiment of the present disclosure.
Figure 3:
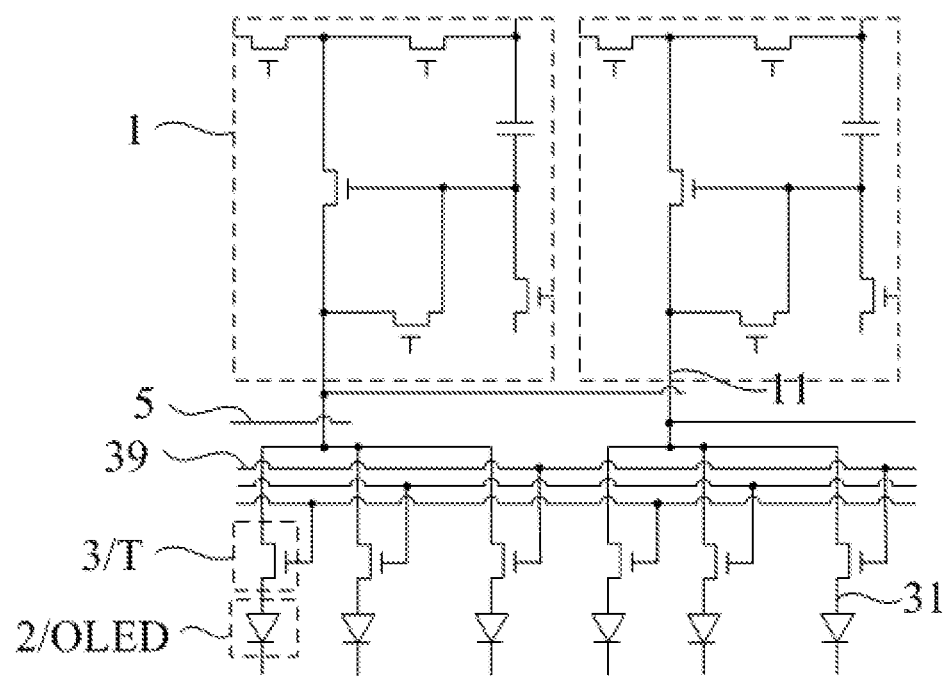
FIG. 3 is a schematic diagram of a partial circuit structure of a display substrate according to an embodiment of the disclosure.

As shown in FIGS. 1 to 3, an embodiment of the present disclosure provides a display substrate including a plurality of driving circuits 1 configured to drive display elements 2 in respective sub-pixels to display, each of the driving circuits 1 is configured to drive a display element 2 in each of at least one sub-pixel to display, and an output terminal 11 of each of the driving circuits 1 is coupled to the display element 2 in each of the at least one sub-pixel to be driven by the driving circuit through a branch 31 provided with a switching element 3.

In the display substrate of the embodiment of the present disclosure, the display element 2 is an element that actually performs display in the sub-pixel. The driving circuit 1 is configured to supply a driving signal (such as a current, a voltage, or the like) to the display element 2 to control the display element 2 to perform display, therefore, the driving circuit 1 is equivalent to a pixel circuit of the sub-pixel. Furthermore, the output terminal 11 of each of the driving circuits 1 may be coupled to the display elements 2 in a plurality of sub-pixels through a plurality of branches 31, respectively, and each of the branches 31 may be provided with a switching element 3. In this way, by controlling on/off of each switching element 3, it is possible to determine the display element 2 which the driving circuit 1 is coupled to and drives. That is, the display substrate according to the embodiment of the present disclosure may adopt a mode in which the pixel circuits are multiplexed, so that each of the pixel circuits may control the display elements in the plurality of sub-pixels to perform display in turn. It should be noted that the output terminal 11 of each driving circuit 1 may also be coupled to the display element 2 in only one sub-pixel through only one branch 31, that is, the display substrate of the embodiment of the present disclosure may also adopt a mode in which the pixel circuits are not multiplexed, that is, each pixel circuit controls the display element in only one sub-pixel to perform display, in this case, the branch 31 may not be provided with the switching element 3.

Theoretically, the display element 2 can be controlled to display as long as the driving circuit 1 is coupled to the display element 2 through the branch 31. However, in order to shorten a wiring, to make the layout reasonable, and the like, the driving circuit 1 is generally arranged to drive only the display element 2 in the vicinity thereof to perform display.

In some implementations, the display substrate of the embodiment of the present disclosure may be an organic light emitting diode array substrate, as shown in FIG. 3, the driving circuit 1 may include an organic light emitting diode driving circuit, and the display element 2 may include an organic light emitting diode (OLED).

It should be understood that the organic light emitting diode driving circuit shown in FIG. 3 may be a driving circuit with threshold compensation function (e.g., may include a plurality of transistors, terminals, capacitors, etc.), and may also be another driving circuit (e.g., a driving circuit of 2T1C) known in the art, the specific form of the organic light emitting diode driving circuit that can be used is various, and will not be described in detail herein.

The display substrate according to the embodiment of the present disclosure is not limited to the organic light emitting diode array substrate, for example, the display substrate according to the embodiment of the present disclosure may also be an array substrate for a liquid crystal display, in which case, the display element 2 may include a pixel electrode (and may also include a common electrode), and the driving circuit 1 may be a pixel electrode driving circuit, which is not described herein again.

The display substrate of the embodiment of the present disclosure further includes at least one repair line 5, each repair line 5 is configured to be associated with at least two driving circuits 1 and is decoupled from the output terminal 11 of at least one driving circuit 1 of the at least two driving circuits 1 in an initial state, and each repair line 5 is couplable to the output terminal 11 of each of the at least two driving circuits 1 associated therewith in response to a failure of one of the at least two driving circuits 1.

For example, in some implementations, as shown in FIGS. 1 to 3, each repair line 5 is associated with two adjacent driving circuits 1, but the repair line 5 is insulated (or decoupled) from the output terminal 11 of at least one of the two driving circuits 1, therefore, in a normal operation, the repair line 5 does not electrically couple the output terminals 11 of the two driving circuits 1 associated therewith, and thus does not affect normal display of the display substrate.

In a case where one of the two driving circuits 1 associated with the repair line 5 fails, the repair line 5 can be coupled with the output terminals 11 of the two driving circuits 1 associated with the repair line 5, that is, the repair line 5 can electrically couple the output terminal 11 of the fault driving circuit 1 with the output terminal 11 of the other driving circuit 1 which normally works, so that a driving signal output by the output terminal 11 of the other driving circuit 1 which normally works can be transmitted to the display element 2 in the sub-pixel originally driven by the fault driving circuit 1 through the repair line 5 (certainly, the display element 2 in the sub-pixel originally coupled with the output terminal 11 of the normal driving circuit 1 can still be driven by the normal driving circuit 1), in this way, the display element 2 in the sub-pixel originally driven by the fault driving circuit 1 can still display, thereby reducing the influence of the failure of the driving circuit 1 on the display, the yield of the product is improved.

In some implementations, in order to avoid the influence of the fault driving circuit 1 on the display element 2 in the sub-pixel associated therewith, the connection between the fault driving circuit 1 and the output terminal thereof may be broken, as shown in FIG. 2, thereby decoupling the fault driving circuit 1 from the display element 2 in the sub-pixel associated with the fault driving circuit 1.

The display substrate of the embodiment of the present disclosure can reduce the influence of the fault of a part of the driving circuits 1 on the display by adding the repair line 5, and the change of the structure of the existing product is small, simple and easy to realize, and the cost is low.

Since each of the driving circuits 1 may fail, in some implementations, each driving circuit 1 may be associated with one repair line 5, so as to ensure that when any driving circuit 1 fails, the display element 2 in the sub-pixel originally driven by the fault driving circuit 1 may be driven by another normal driving circuit 1 through the repair line 5 to perform display.

In some implementations, the plurality of driving circuits 1 included in the display substrate according to the embodiment of the present disclosure may be grouped, for example, each group may include two driving circuits 1, each of the repair lines 5 may be configured to be associated with one group of driving circuits 1, and in a normal operation, the repair line 5 may be decoupled (or insulated) from the output terminal of at least one driving circuit 1 in the group of driving circuits 1, and in a case where one driving circuit 1 in the group of driving circuits 1 fails, the repair line 5 associated with the group of driving circuits 1 may electrically couple the output terminal 11 of the fault driving circuit 1 to the output terminal 11 of the other driving circuit 1 in a normal operation, so that a driving signal output from the output terminal 11 of the other driving circuit 1 in a normal operation may be transmitted to the display element 2 in the sub-pixel originally driven by the fault driving circuit 1 through the repair line 5, the display element 2 in the sub-pixel originally driven by the fault driving circuit 1 can still display, thereby reducing the influence of the failure of the driving circuit 1 on the display and improving the product yield.

In some implementations, the plurality of driving circuits 1 included in the display substrate according to the embodiment of the present disclosure may include a dedicated repair driving circuit, for example, each of the repair lines 5 may be configured to be associated with the dedicated repair driving circuit and at least one other driving circuit 1, and in a normal operation, the repair line 5 is decoupled (or insulated) from an output terminal of at least one of the dedicated repair driving circuit and the at least one other driving circuit 1 associated therewith, and in a case where one of the at least one other driving circuit 1 associated with the repair line 5 fails, the repair line 5 associated with the fault driving circuit 1 may electrically couple the output terminal 11 of the fault driving circuit 1 to the output terminal of the dedicated repair driving circuit 1, so that a driving signal output by the output terminal of the dedicated repair driving circuit may be transmitted to the display element in the sub-pixel originally driven by the fault driving circuit 1 through the repair line 5, thus the display element 2 in the sub-pixel originally driven by the fault driving circuit 1 can still display, so that the influence of the failure of the driving circuit 1 on the display is reduced, and the product yield is improved.

Figure 4:
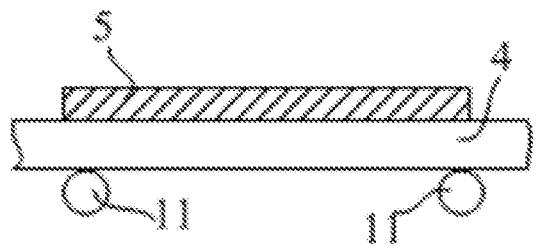
FIG. 4 is a partial cross-sectional view of a display substrate according to an embodiment of the present disclosure.

In some implementations, as shown in FIG. 4, an insulating layer 4 is disposed between each repair line 5 and the output terminal 11 of the driving circuit 1 associated with the repair line 5, and an orthographic projection of each repair line 5 on the insulating layer 4 at least partially overlaps an orthographic projection of the output terminal 11 of the driving circuit 1 associated with the repair line 5 on the insulating layer 4.

That is, each repair line 5 and the output terminal 11 of the driving circuit 1 associated with the repair line 5 may be disposed at different layers, and an insulating layer 4 may be disposed between each repair line 5 and the output terminal 11 of the driving circuit 1 associated with the repair line 5, the orthographic projection of each repair line 5 on the insulating layer 4 at least partially overlaps the orthographic projection of the output terminal 11 of the driving circuit 1 associated with the repair line 5 on the insulating layer 4. In a case where a via hole is provided in the insulating layer 4 at an overlapping position of the orthographic projection of the repair line 5 and the orthographic projection of the output terminal 11 of the driving circuit 1, the repair line 5 may be coupled to the output terminal 11 of the driving circuit 1 through the via hole (and a conductor in the via hole). For example, a via hole may be formed in the insulating layer 4 at a corresponding position in response to irradiation of laser thereon, and at the same time, a part of the repair line 5 at a corresponding position may be irradiated by the laser so as to be melt, and a material of the melted repair line 5 flows into the corresponding via hole, thereby electrically coupling the repair line 5 to the output terminal 11 of the corresponding driving circuit 1.

It should be understood that each repair line 5 may also be decoupled or coupled to the output terminal 11 of the driving circuit 1 associated therewith through a switching element, in this case, a corresponding control circuit may also be provided to control on/off of the switching element, so as to control the decoupling or coupling between each repair line 5 and the output terminal 11 of the driving circuit 1 associated with the repair line 5, which is not described herein again.

In some implementations, each repair line 5 is associated with two driving circuits 1, and each repair line 5 is coupled to the output terminal 11 of one of the driving circuits 1 associated therewith, and is decoupled (or insulated) from the output terminal 11 of the other one of the driving circuits 1 associated therewith.

That is, in a case where both of the two driving circuits 1 associated with the repair line 5 operate normally, the repair line 5 is already coupled to the output terminal 11 of one of the two driving circuits 1 associated therewith, and in a case where any one of the two driving circuits 1 associated with the repair line 5 fails, it is only required to couple the repair line 5 to the output terminal 11 of the other of the two driving circuits 1 associated with the repair line 5, so that the required amount of work can be reduced.

In some implementations, the display substrate of the embodiment of the present disclosure includes a plurality of driving circuits 1 arranged in an array, each row of driving circuits 1 are coupled to one gate line 91, each column of driving circuits 1 are coupled to one data line 92, and at least two driving circuits 1 associated with each repair line 5 are located in a same row.

For example, each row of driving circuits 1 can drive the display elements 2 in a same row of sub-pixels to display, and each column of driving circuits 1 can drive the display elements in a same column of sub-pixels to display.

Since each of the driving circuits 1 corresponds to a pixel circuit in one sub-pixel, the driving circuits 1 can be controlled in such a manner as to control the sub-pixels. As shown in FIGS. 1 to 3, a plurality of driving circuits 1 may be arranged in an array, and each row of driving circuits 1 is coupled to one gate line 91, so that the driving circuits 1 in the same row (i.e. coupled to the same gate line 91) should operate simultaneously (i.e. simultaneously drive the display elements 2 in each sub-pixel coupled to its output terminal 11 to display), and therefore, when any driving circuit 1 fails, the display element 2 in the sub-pixel originally driven by the fault driving circuit 1 may be driven by another driving circuit 1 in the same row as the fault driving circuit 1 to display, so that the display elements 2 in the sub-pixels driven by the driving circuits 1 in the same row still display synchronously.

In some implementations, each repair line 5 is associated with two adjacent driving units 1 in a same row.

In addition, the display contents of the display elements 2 in the sub-pixels driven by different driving circuits 1 are generally different. However, in a case where any driving circuit 1 fails, and the display element 2 in the sub-pixel originally driven by the fault driving circuit 1 is driven by another driving circuit 1 in a same row as the fault driving circuit 1 to perform display, the display contents of the display elements 2 in the sub-pixels driven by the different driving circuits 1 are the same, so display deviation exist. However, since the display contents of the display elements 2 in the adjacent sub-pixels are generally not greatly different, and the driving circuits 1 driving the display elements 2 of the adjacent sub-pixels to perform display are generally adjacent, in a case where any driving circuit 1 fails, the display element 2 in the sub-pixel originally driven by the fault driving circuit 1 can be driven by the adjacent driving circuit 1 in the same row as the fault driving circuit 1 to perform display. Therefore, the influence on the display effect is small, even to the extent that the influence on the display effect cannot be distinguished by naked eyes.

In some implementations, each driving circuit 1 may be configured to drive the display elements 2 in n sub-pixels to perform display, the output terminal 11 of each driving circuit 1 is coupled with the display elements 2 in the sub-pixels driven by the driving circuit through branches 31 each having a switching element 3 provided thereon, respectively, where n is an integer greater than or equal to 2.

In a case where the number of display elements 2 of the sub-pixels respectively driven by the driving circuits 1 is the same, even if the display elements 2 of the sub-pixels originally driven by different driving circuits 1 are changed to be driven by a same driving circuit 1, there is no need to change the driving method of the driving circuit 1.

In some implementations, the display elements 2 of the sub-pixels driven by the driving circuits 1 associated with each repair line 5 display same colors, and in a case where each driving circuit 1 is configured to drive the display elements 2 of a plurality of sub-pixels to perform display, the display elements 2 of the sub-pixels driven by the respective driving circuits 1 display colors in a same color distribution.

That is, in a case where each repair line 5 is associated with two driving circuits 1, the colors displayed by the display elements 2 of the sub-pixels driven by the two driving circuits 1 have a same color distribution (for example, the display elements 2 of the sub-pixels driven by each driving circuit 1 sequentially display red R, blue B, and green G). Thus, even if the display elements 2 of the sub-pixels originally driven by different driving circuits 1 are changed to be driven by a single driving circuit 1, the single driving circuit 1 drives the display elements 2 of the two groups of sub-pixels to display same colors at a same time, so that the influence on the display effect can be reduced, even to the extent that the influence on the display effect cannot be distinguished by naked eyes.

In some implementations, in a case where the display substrate of the embodiment of the present disclosure includes a plurality of driving circuits 1 arranged in an array, and each driving circuit 1 is configured to drive the display elements 2 of n sub-pixels to perform display, each driving circuit 1 may be coupled to the display elements 2 of the n sub-pixels driven by it through n branches 31 each having a switching element 3 thereon, the switching elements 3 of the branches 31 are controlled by separate control lines respectively. For example, all the switching elements 3 of the branches 31 to which the outputs 11 of a same row of driving circuits 1 are coupled may share n control lines 39, and the switching elements 3 of the n branches 31 to which the output terminal 11 of each driving circuit 1 is coupled are controlled by the n control lines 39 in one-to-one correspondence.

As shown in FIGS. 1 to 3, in a case where the number of the display elements 2 of the sub-pixels driven by respective driving circuit 1 is the same (for example, n), all the switching elements 3 of the branches 31 coupled to the output terminals 11 of the driving circuits 1 in a same row may share n control lines 39, the switching elements 3 of the n branches 31 coupled to the output terminal 11 of each driving circuit 1 are controlled by the n control lines 39 in one-to-one correspondence, and each control line 39 is coupled to one of the switching elements 3 of the n branches 31 coupled to each of the driving circuits 1 in a same row. Therefore, when an ON signal (i.e., a signal that turns on the switching element 3) is applied to any one of the control lines 39, the output terminal of each driving circuit 1 in the corresponding row is electrically coupled with the display element 2 of a corresponding sub-pixel through a branch 31 where the switching element 3 controlled by the control line 39 is located, so as to drive the display element to perform display, and by applying the ON signal to the control lines 39 in turn, each driving circuit 1 can be electrically coupled with the display elements 2 in the sub-pixels through the branches 31 coupled to the output terminal of the driving circuit in turn, so as to drive the display elements 2 to perform display in turn.

In some implementations, as shown in FIG. 3, the switching element 3 in the embodiment of the present disclosure may be a switching transistor T, a first electrode of which may be coupled to the output terminal 11 of the driving circuit 1, a second electrode of which may be coupled to the display element 2 of the sub-pixel, and a gate of which may be coupled to the control line 39.

Certainly, the switching element 3 in the embodiment of the present disclosure is not limited to the switching transistor T, and any other type of element having a switching function may be used as the switching element 3, which is not described herein again.

In addition, in a case where the display substrate of the embodiment of the present disclosure adopts a mode in which the pixel circuit is multiplexed, the output terminal 11 of the driving circuit 1 may also be coupled to the display elements 2 of the plurality of sub-pixels through a single-pole multi-throw switch, which is not described herein again.

Figure 5:
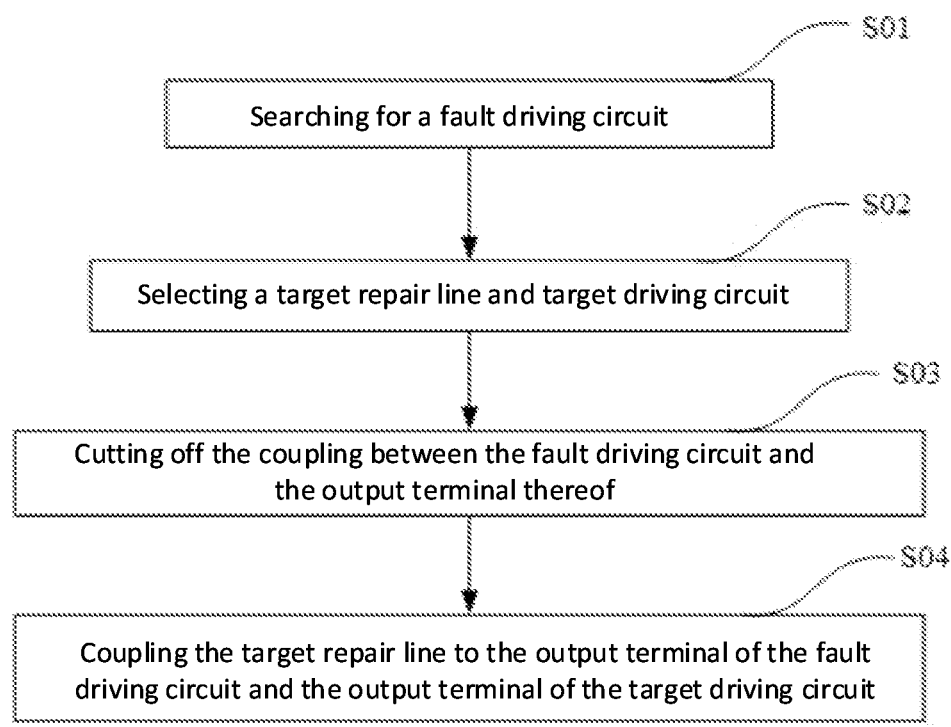
FIG. 5 is a flowchart of a method for repairing a display substrate according to an embodiment of the present disclosure.

Embodiments of the present disclosure also provide a repairing method of a display substrate, as shown in FIGS. 2 and 5, and the repairing method may include the following steps S01 to S04.

In step S01, the driving circuit 1 which cannot drive the display element 2 of the sub-pixel to display is searched for and set as a fault driving circuit 18.

In step S02, a repair line 5 associated with the fault driving circuit 18 is selected as a target repair line 59, and a driving circuit 1 other than the fault driving circuit 18, which is associated with the target repair line 59 and works normally, is selected as a target driving circuit 19.

In step S03, coupling between the fault driving circuit 18 and an output terminal 11 thereof is cut off.

In step S04, the target repair line 59 is coupled to an output terminal 11 of the fault driving circuit 18 and an output terminal 11 of the target driving circuit 19, so that the target driving circuit 19 is coupled to the display elements 2 of the sub-pixels originally driven by the fault driving circuit 18.

In some implementations, in the step S01, the driving circuit 1 (i.e., the fault driving circuit 18) that fails and cannot drive the display elements of the corresponding sub-pixels is determined by performing a detection. In the step S03, as shown in FIG. 5, the coupling between the fault driving circuit 18 and its output terminal 11 is cut off, so that the fault driving circuit 18 cannot affect the display elements 2 of the corresponding sub-pixels any longer. In the step S04, the output terminal 11 of another driving circuit (the target driving circuit 19) is coupled to the output terminal 11 of the fault driving circuit 18 through the repair line (the target repair line 59), so that the target driving circuit 19 can be used to drive the display elements 2 of the sub-pixels originally driven by the fault driving circuit 18 to perform display, thereby reducing the influence of the fault driving circuit on the display effect.

It should be understood that in the step S03, cutting off the coupling between the fault driving circuit 18 and its output terminal 11 is actually cutting off the coupling between the output terminal 11 of the fault driving circuit 18 and the display elements 2 of the sub-pixels driven by the fault driving circuit. For example, as shown in FIG. 2, the coupling between the output terminal 11 of the fault driving circuit 18 and the display elements 2 of the sub-pixels driven by the fault driving circuit 18 is cut off at a point N1, and then in the step S04, the target repair line 59 is coupled to a point N2 of the output terminal 11 of the fault driving circuit 18 and a point N3 of the output terminal 11 of the target driving circuit 19, so that, after the step S04, the display elements 2 of the sub-pixels originally driven by the fault driving circuit 18 are coupled only to the target driving circuit 19 and driven thereby.

It should also be understood that, in a case where each repair line 5 is associated with two driving circuits 1, each repair line 5 may be originally insulated from both the output terminals 11 of the two driving circuits 1 (e.g., the output terminal of the driving circuit 18 and the output terminal of the driving circuit 19) with which the repair line 5 is associated, or may be insulated from only the output terminal 11 of one of the driving circuits 1 (e.g., the output terminal of the driving circuit 19), and therefore, in the step S04, the target repair line 59 being coupled to the output terminal 11 of the fault driving circuit 18 and the output terminal 11 of the target driving circuit 19, is actually coupling the repair line 5 to the output terminal 11 of the driving circuit 1 from which the repair line 5 is originally insulated, e.g., the repair line is originally coupled at the point N2 in FIG. 2, and a new coupling is formed at the point N3 in the step S04.

In addition, in the embodiment of the present disclosure, the order that the steps S03 and S04 are performed is not limited, either one of them may be performed first or both of them may be performed simultaneously, as long as after steps S03 and S04, the target driving circuit 19 can be coupled to the display elements 2 of the sub-pixels originally driven by the fault driving circuit 18.

In some implementations, coupling between the fault driving circuit 18 and its output terminal 11 being cut off in the step S03 includes: cutting off the coupling between the fault driving circuit 18 and its output terminal 11 by means of laser cutting.

In some implementations, the target repair line 59 being coupled to the output terminal 11 of the fault driving circuit 18 and the output terminal 11 of the target driving circuit 19 in the step S04 includes: coupling the target repair line 59 to the output terminal of the fault driving circuit 18 and the output terminal of the target driving circuit 19 by means of laser short-circuiting.

That is, the cutting in the step S03 may be performed by using laser, such as a cutting open is performed by using a laser cutting apparatus, i.e., the coupling between the fault driving circuit 18 and its output terminal 11 is broken by laser fusing; the coupling in the step S04 may also be performed by laser, such as laser short-circuiting (Laser Short) by a laser cutting apparatus, i.e., an overlapping position of the orthographic projections of the target repair line 59 and the output terminal 11 of the driving circuit 1 is irradiated by using laser, a via hole is formed at a corresponding position of the insulating layer between the target repair line 59 and the output terminal 11 of the driving circuit 1, and for example, a corresponding portion of the repair line 59 is melt to flow into the formed via hole, so that the target repair line 59 is coupled to the output terminal 11 of the driving circuit 1.

Certainly, in the embodiments of the present disclosure, the cutting off may be performed by using laser, and may also be performed by a mechanical cutting method. In addition, the repair line 5 may alternatively be coupled to the output terminal 11 of the driving circuit 1 by any other suitable method such as tungsten powder deposition, which will not be described herein again.

In addition, both the repair line and the output terminal of the driving circuit in the embodiment of the disclosure include conductive materials.

The embodiment of the present disclosure further provides a display device, which includes the display substrate.

That is, the display substrate of the embodiment of the present disclosure may be combined with other components to form a completed display device, and the display device may be any product or component having a display function, such as electronic paper, a mobile phone, a tablet computer, a television, a display, a notebook computer, a digital photo frame, and a navigator.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A display substrate comprising a plurality of driving circuits, each of which is configured to drive a display element in each of at least one sub-pixel to perform display, an output terminal of each of the driving circuits is coupled to the display element in the sub-pixel driven by the driving circuit through a branch having a switching element therein, the display substrate further comprising:

at least one repair line, each of which is configured to be associated with at least two driving circuits and to be initially decoupled from an output terminal of at least one of the at least two driving circuits, wherein, each repair line is couplable to the output terminals of the at least two driving circuits with which the repair line is associated in response to a failure of one of the at least two driving circuits.

2. The display substrate of claim 1, wherein
the plurality of driving circuits are arranged in an array, each row of driving circuits is controlled by a gate line, each repair line is configured to be associated with two adjacent driving circuits of a same row and is initially decoupled from the output terminal of at least one of the two adjacent driving circuits, and,
each repair line is couplable to the output terminals of the two adjacent driving circuits in response to a failure of one of the two adjacent driving circuits.

3. The display substrate of claim 1, wherein
the plurality of driving circuits are arranged in an array, each row of driving circuits is controlled by a gate line, any two driving circuits in a same row of driving circuits are grouped into a group, each repair line is configured to be associated with one group of driving circuits and is initially decoupled from the output terminal of at least one driving circuit in the group of driving circuits,
each repair line is couplable to the output terminals of the group of driving circuits in response to a failure of one of the group of the driving circuits.

4. The display substrate of claim 1, wherein
the plurality of driving circuits are arranged in an array, each row of driving circuits is controlled by a gate line, one driving circuit in each row of driving circuits is configured as a dedicated repair driving circuit, each repair line is configured to be associated with the dedicated repair driving circuit and at least one other driving circuit, other than the dedicated repair driving circuit, in the same row as the dedicated repair driving circuit, and is initially decoupled from an output terminal of at least one of the dedicated repair driving circuit and the at least one other driving circuit, and wherein,
each repair line is couplable, in response to a failure of a fault driving circuit of the at least one other driving circuit, to the dedicated repair driving circuit and the output terminal of the fault driving circuit.

5. The display substrate of claim 1, wherein
the plurality of driving circuits are arranged in an array, each row of driving circuits is controlled by a gate line, the driving circuits associated with each repair line is located in a same row, the display elements in the sub-pixels driven by the driving circuits associated with each repair line display same colors, and each repair line is initially decoupled from the output terminal of at least one of the driving circuits associated with the repair line, and
each repair line is couplable, in response to a failure of a fault driving circuit of the driving circuits associated with the repair line, to the output terminals of the driving circuit which normally works and the fault driving circuit in the driving circuits associated with the repair line.

6. The display substrate of claim 1, wherein
each of the driving circuits is configured to drive display elements in n sub-pixels to perform display, and for each of the driving circuits, the output terminal of the driving circuit is coupled to the display elements in the sub-pixels driven by the driving circuit through branches each having a switching element therein, wherein n is an integer greater than or equal to 2.

7. The display substrate of claim 6, wherein
for each of the driving circuits, the output terminal of the driving circuit is coupled to the display elements of the n sub-pixels driven by the driving circuit through the n branches each having a switching element therein, the switching elements of the n branches being controlled by separate control lines, respectively.

8. The display substrate of claim 7, wherein
the plurality of driving circuits are arranged in an array, each row of driving circuits is controlled by a gate line, the switching elements in the branches coupled to the output terminals of a same row of driving circuits share n control lines, and each of the switching elements in the n branches coupled to the output terminal of each of the driving circuits of the same row is controlled by one of the n control lines.

9. The display substrate of claim 7, wherein
the switching element is a switching transistor, a first electrode of the switching transistor is coupled to the output terminal of the driving circuit, a second electrode of the switching transistor is coupled to the display element in the sub-pixel driven by the driving circuit, and a gate of the switching transistor is coupled to a corresponding control line.

10. The display substrate of claim 6, wherein
for the at least two driving circuits associated with the repair line, the display elements in the sub-pixels driven by the respective driving circuits display colors in a same color distribution.

11. The display substrate of claim 1, wherein
each repair line is insulated from the output terminals of the at least two driving circuits associated with the repair line through an insulating layer, and an orthographic projection of the repair line on the insulating layer is at least partially overlapped with an orthographic projection of the output terminals of the at least two driving circuits associated with the repair line on the insulating layer.

12. The display substrate of claim 1, wherein
each driving circuit is associated with one repair line.

13. The display substrate of claim 1, wherein
the display substrate is an organic light emitting diode array substrate, the driving circuit comprises an organic light emitting diode driving circuit, and the display element comprises an organic light emitting diode.

14. A display device, comprising:
the display substrate according to claim 1.

* * * * *